(12) United States Patent
Ren

(10) Patent No.: US 9,660,192 B2
(45) Date of Patent: May 23, 2017

(54) ORGANIC ELECTROLUMINESCENT DISPLAY DEVICE WITH METAL REFLECTIVE LAYER

(71) Applicant: BOE Technology Group Co., Ltd., Beijing (CN)

(72) Inventor: Zhangchun Ren, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 14/415,242

(22) PCT Filed: May 22, 2014

(86) PCT No.: PCT/CN2014/078107
§ 371 (c)(1),
(2) Date: Jan. 16, 2015

(87) PCT Pub. No.: WO2015/096367
PCT Pub. Date: Jul. 2, 2015

(65) Prior Publication Data
US 2016/0013415 A1  Jan. 14, 2016

(30) Foreign Application Priority Data
Dec. 27, 2013 (CN) .......................... 2013 1 0743031

(51) Int. Cl.
*H01L 29/08* (2006.01)
*H01L 51/00* (2006.01)
(Continued)

(52) U.S. Cl.
CPC ........ *H01L 51/0023* (2013.01); *H01L 27/322* (2013.01); *H01L 27/3248* (2013.01);
(Continued)

(58) Field of Classification Search
CPC ............... H01L 27/322; H01L 27/3248; H01L 27/3262; H01L 27/3276; H01L 29/66969;
(Continued)

(56) References Cited

U.S. PATENT DOCUMENTS 7,893,440 B2   2/2011  Kwon et al.
9,245,933 B2   1/2016  Shi et al.
(Continued)

FOREIGN PATENT DOCUMENTS

CN    1645450 A    7/2005
CN    1705415 A   12/2005
(Continued)

OTHER PUBLICATIONS

Second Office Action, including Search Report, for Chinese Patent Application No. 201310743031.1, dated Jan. 26, 2016, 10 pages.
(Continued)

*Primary Examiner* — Hung Vu
(74) *Attorney, Agent, or Firm* — Westman, Champlin & Koehler, P.A.

(57) ABSTRACT

Disclosed is an organic electroluminescent display device, a method for manufacturing the same and a display apparatus. The organic electroluminescent display device comprises: a substrate; a thin film transistor disposed on the substrate and including a gate electrode and an active layer insulated with each other, and a source electrode and a drain electrode connected with the active layer; and an organic electroluminescent structure disposed on the substrate and including an anode, a luminescent layer and a cathode stacked sequentially, the anode and the drain electrode being electrically connected with each other. The anode and the active layer are disposed in the same layer. The active layer is made of a transparent oxide semiconductor material. The anode is made of the transparent oxide semiconductor material
(Continued)

undergone a plasma treatment. When producing the OLED device, the active layer and the anode may be simultaneously produced only by changing the pattern of the corresponding mask without additional patterning processes for producing the anodes, thereby simplifying process steps and saving production costs.

7 Claims, 5 Drawing Sheets

(51) Int. Cl.

| | | |
|---|---|---|
| *H01L 51/52* | (2006.01) | |
| *H01L 27/32* | (2006.01) | |
| *H01L 29/24* | (2006.01) | |
| *H01L 29/417* | (2006.01) | |
| *H01L 29/423* | (2006.01) | |
| *H01L 29/66* | (2006.01) | |
| *H01L 29/786* | (2006.01) | |
| *H01L 51/56* | (2006.01) | |

(52) U.S. Cl.
CPC ...... *H01L 27/3262* (2013.01); *H01L 27/3276* (2013.01); *H01L 29/24* (2013.01); *H01L 29/41733* (2013.01); *H01L 29/42384* (2013.01); *H01L 29/66969* (2013.01); *H01L 29/7869* (2013.01); *H01L 51/5206* (2013.01); *H01L 51/5271* (2013.01); *H01L 51/56* (2013.01); *H01L 2227/323* (2013.01)

(58) Field of Classification Search
CPC ......... H01L 29/41733; H01L 29/42384; H01L 29/24; H01L 29/7869; H01L 51/0023; H01L 51/5206; H01L 51/5271; H01L 51/56

USPC .............................................. 257/40, 59, 72
See application file for complete search history.

(56) References Cited

U.S. PATENT DOCUMENTS

| | | | |
|---|---|---|---|
| 2005/0151830 A1 | 7/2005 | Yamazaki | |
| 2008/0143653 A1* | 6/2008 | Shishido | G09G 3/3233 345/78 |
| 2010/0200851 A1* | 8/2010 | Oikawa | H01L 27/1214 257/43 |
| 2015/0179679 A1 | 6/2015 | Im | |

FOREIGN PATENT DOCUMENTS

| | | |
|---|---|---|
| CN | 101577283 A | 11/2009 |
| CN | 102646717 A | 8/2012 |
| CN | 102651455 A | 8/2012 |
| CN | 103295962 A | 9/2013 |
| CN | 103474448 A | 12/2013 |
| CN | 103681773 A | 3/2014 |

OTHER PUBLICATIONS

International Search Report and Written Opinion (in Chinese) for PCT Application No. PCT/CN2014/078107, dated Jul. 30, 2014, 11 pages.
First Chinese Office Action for Chinese Application No. 201310743031.1, dated Aug. 27, 2015, 13 pages.
Written Opinion, including English translation of Box No. V., for the International Searching Authority for International Application No. PCT/CN2014/078107, dated Jul. 30, 2014, 10 pages.
Third Office Action, including Search Report, for Chinese Patent Application No. 201310743031.1, dated Jun. 14, 2016, 15 pages.
Rejection Decision for Chinese Patent Application No. 201310743031.1, dated Oct. 28, 2016, 10 pages.

\* cited by examiner

ORGANIC ELECTROLUMINESCENT DISPLAY DEVICE WITH METAL REFLECTIVE LAYER

CROSS-REFERENCE TO RELATED APPLICATION

This Application is a Section 371 National Stage Application of International Application No. PCT/CN2014/078107, filed 22 May 2014, which has not yet published, which claims priority to Chinese Application No. 201310743031.1, filed Dec. 27, 2013, in Chinese, the contents of which are hereby incorporated by reference in their entirety.

BACKGROUND OF THE INVENTION

Field of the Invention

Embodiments of the present invention generally relate to field of display technique, particularly to an organic electroluminescent display device, a method for producing the same and a display apparatus.

Description of the Related Art

Currently, an organic electroluminescent display (OLED) device has been widely used in a display apparatus due to its characteristics of quick response, wide color gamut, ultra-thin structure, and the capability of becoming flexible and the like as compared to a conventional liquid crystal display (LCD) device.

The OLED device generally comprises a thin film transistor array substrate and an organic electroluminescent structure. In the OLED device, a thin film transistor generally includes a gate electrode, an active layer, a source electrode and a drain electrode. The organic electroluminescent structure generally includes an anode, a luminescent layer and a cathode. Specifically, a bottom-emission-type OLED device as shown in FIG. 1 mainly comprises a substrate 1, and a gate electrode 2, a gate insulating layer 3, an active layer 4, a etch stop layer 5, a source electrode 6, a drain electrode 7, an insulating layer 8, a color filter 9, an anode 10, a pixel defining layer 11, a luminescent layer 12 and a cathode 13 which are sequentially disposed on the substrate 1.

When producing the OLED device of the above structure, components formed by a pattern process using a mask comprise at least the gate electrode, the active layer, the etch stop layer, the source electrode, the drain electrode, the insulating layer, the color filter, the anode and the pixel defining layer. Since the color filter is generally composed of monochromatic filters formed by alternatively arranging three primary colors (red, green, blue), it is necessary to use three masks to perform patterning operation respectively when producing the color filter.

In overview, when manufacturing the conventional OLED device, it is necessary to use a plurality of masks to perform the patterning process. Therefore, the manufacturing process of the conventional OLED devices has problems of complicated production process, many manufacturing steps, high cost, time-consuming and the like.

SUMMARY OF THE INVENTION

In order to overcome or alleviate at least one aspect of the above mentioned disadvantages, embodiments of the present invention provides an organic electroluminescent display device, a method for manufacturing the same and a display apparatus, which can simplify production process, reduce production cost and shorten production time of the OLED device.

According to an aspect of the present invention, there is provided an organic electroluminescent display device comprising: a substrate; a thin film transistor which is disposed on the substrate and includes a gate electrode and an active layer insulated with each other, and a source electrode and a drain electrode electrically connected with the active layer; and an organic electroluminescent structure which is disposed on the substrate and includes an anode, a luminescent layer and a cathode stacked sequentially, the anode and the drain electrode being electrically connected with each other, wherein the anode and the active layer are disposed in a same layer, the active layer is made of a transparent oxide semiconductor material, and the anode is made of the transparent oxide semiconductor material undergone a plasma treatment.

In the organic electroluminescent display device as described above according to an embodiment of the present invention, since the active layer is made of the transparent oxide semiconductor material and performing the plasma treatment on the oxide semiconductor material may increase concentration of carriers therein, it is possible to use the oxide semiconductor material of which the active layer is made to produce the anode, so that the anode and the active layer are disposed in the same layer. In this way, when producing the OLED device, the active layer and the anode may be simultaneously produced only by changing the pattern of the corresponding mask without additional patterning processes for producing the anodes, thereby simplifying process steps, saving production costs, improving production efficiency and shortening production time.

In the organic electroluminescent display as described above, in the thin film transistor, the active layer is disposed above the gate electrode, a gate insulating layer is disposed between the active layer and the gate electrode, and both the source electrode and the drain electrode are disposed above the active layer.

In the organic electroluminescent display device as described above, in the thin film transistor, the gate electrode is disposed above the active layer, a gate insulating layer is disposed between the active layer and the gate electrode, and both the source electrode and the drain electrode are disposed between the active layer and the substrate.

In the organic electroluminescent display device as described above, in the thin film transistor, the gate electrode is disposed above the active layer, a gate insulating layer is disposed between the active layer and the gate electrode, and both the source electrode and the drain electrode are disposed above the gate electrode and are connected with the active layer through via holes.

In the organic electroluminescent display device as described above, the luminescent layer of the organic electroluminescent structure emits white lights. The organic electroluminescent display device further comprises a color filter which is disposed above the organic electroluminescent structure or between the gate insulating layer and the organic electroluminescent structure.

In the organic electroluminescent display device as described above, the luminescent layer of the organic electroluminescent structure emits white lights. The organic electroluminescent display device further comprises a color filter which is disposed above or below the organic electroluminescent structure.

In order to save production costs and improve the production efficiency, the organic electroluminescent display device further comprises a metal reflective layer which is disposed in a region corresponding to the organic electroluminescent structure, the metal reflective layer and the gate electrode being disposed in a same layer and made of a same material.

According to an embodiment of another aspect of the present invention, there is provided a display apparatus comprising the organic electroluminescent display device as described in the above embodiments.

According to an embodiment of further another aspect of the present invention, there is provided a method for producing the organic electroluminescent display device as described in the above embodiments, in a step of forming the thin film transistor and the organic electroluminescent structure on the substrate, forming the active layer of the thin film transistor and the anode of the organic electroluminescent structure by using a single patterning process; and performing the plasma treatment on the formed anode.

In the method for producing the organic electroluminescent display device according to the embodiment of the present invention, since the active layer of the thin film transistor and the anode of the organic electroluminescent structure are formed by the single patterning process, the active layer and the anode may be simultaneously produced only by changing the pattern of the corresponding mask without additional patterning process for producing the anode, thereby simplifying process steps, saving production costs, improving production efficiency and shortening production time.

In the method as described above, the step of forming the thin film transistor on the substrate comprises: forming the gate electrode on the substrate; forming the active layer on the substrate formed with the gate electrode; and forming the source electrode and the drain electrode on the substrate formed with the active layer, wherein a metal reflective layer is formed in a region on the substrate corresponding to the organic electroluminescent structure while forming the gate electrode on the substrate. In this way, it is possible to further simplify production process, saving production costs and improve production efficiency.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

Figure 1:
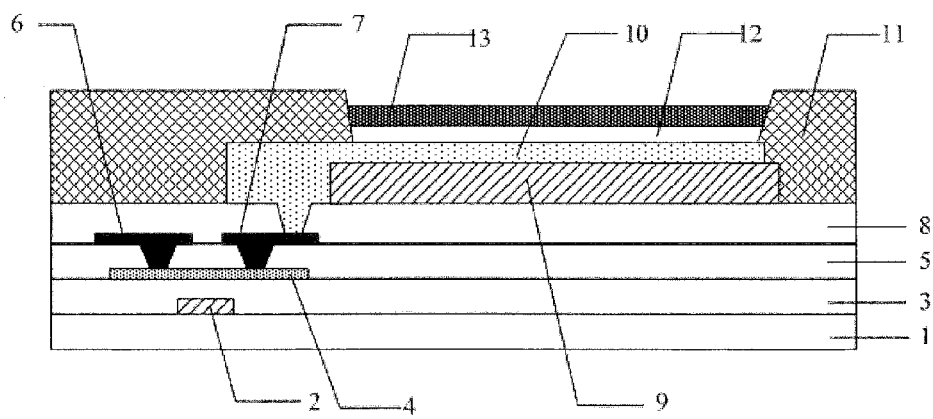
FIG. 1 is a schematic structural view of a conventional organic electroluminescent display device.

In order to completely understand the technical solution of the present invention, exemplary embodiments of the present disclosure will be described hereinafter in detail with reference to the attached drawings. Obviously, the described embodiments are merely part of the embodiments of the present invention, rather than all of the embodiments of the present invention. Based on the embodiments of the present invention, other embodiments acquired by the person skilled in the art without any inventive effort will be within the protection scope of the present invention.

The shape and size of each film layer in the attached drawings do not represent the real scale of the OLED device. Moreover, only partial structures of the OLED device are shown and are intended to schematically illustrate the content of the present invention. In addition, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and components are schematically shown in order to simplify the drawing.

Figure 2A:
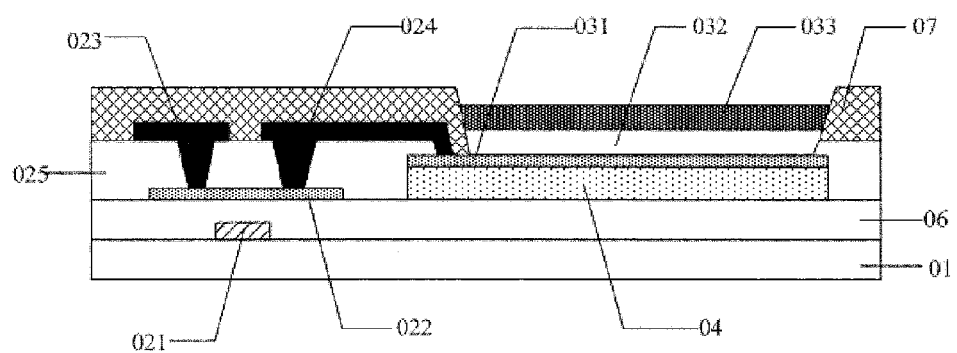
FIG. 2a is a schematic structural view of an organic electroluminescent display device according to a first exemplary embodiment of the present invention.
Figure 2B:
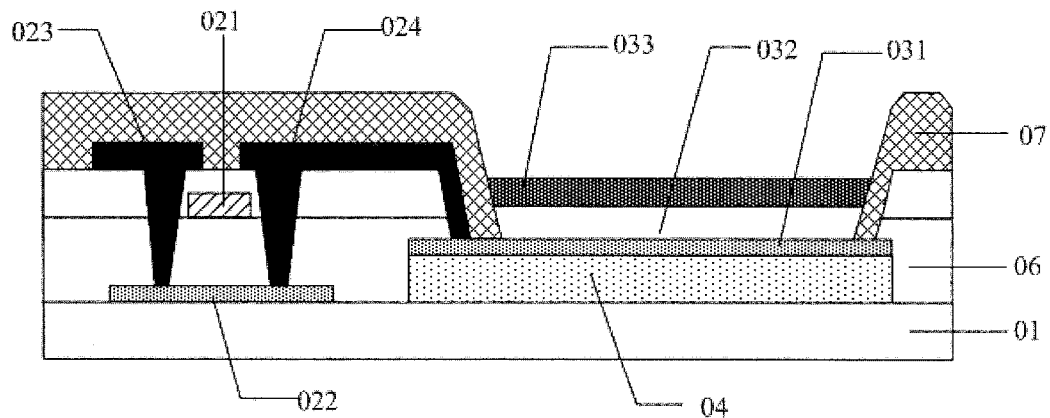
FIG. 2b is a schematic structural view of an organic electroluminescent display device according to a second exemplary embodiment of the present invention.
Figure 2C:
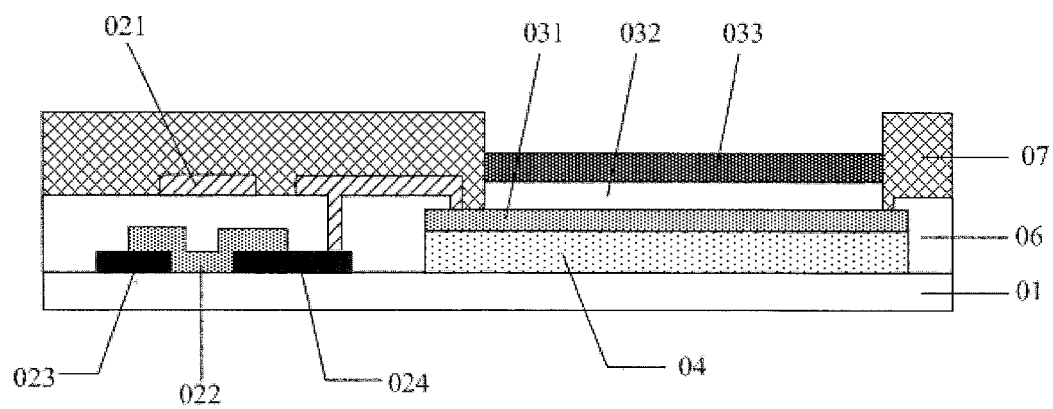
FIG. 2c is a schematic structural view of an organic electroluminescent display device according to a third exemplary embodiment of the present invention.

As shown in FIGS. 2a to 2c, an organic electroluminescent display device according to various exemplary embodiments of the present invention, taken one pixel unit in the organic electroluminescent display device as an example, comprises a substrate 01, a thin film transistor and an organic electroluminescent structure disposed on the substrate 01. The thin film transistor includes a gate electrode 021 and an active layer 022 which are insulated with each other, and a source electrode 023 and a drain electrode 024 which are electrically connected with the active layer 022. The organic electroluminescent structure includes an anode 031, a luminescent layer 032 and a cathode 033 which are disposed to be sequentially stacked in a direction away from the substrate 01 (an upward direction in FIGS. 2a to 2c and FIG. 3), wherein the anode 031 and the drain electrode 024 are electrically connected with each other. The anode 031 and the active layer 022 are disposed in the same layer. The active layer 022 is made of a transparent oxide semiconductor material, and the anode 031 is made of the transparent oxide semiconductor material undergone a plasma treatment.

In the organic electroluminescent display device as described above according to the embodiment of the present invention, since the active layer is made of the transparent oxide semiconductor material and performing the plasma treatment on the oxide semiconductor material may increase concentration of carriers therein, it is possible to use the oxide semiconductor material of which the active layer is made to produce the anode, so that the anode and the active layer are disposed in the same layer. In this way, when manufacturing the OLED display device, the active layer and the anode can be simultaneously produced only by changing the pattern of the corresponding mask without additional patterning processes for producing the anodes, thereby simplifying process steps, saving production costs, improving production efficiency and shortening production time.

In the organic electroluminescent display device as described above according to a further exemplary embodiment of the present invention, the active layer may be made of indium gallium zinc oxide (IGZO), zinc oxide (ZnO), indium zinc oxide (IZO) or indium tin zinc oxide (ITZO). However, the active layer may also be made of other materials which can implement the present invention and not be limited to herein.

In the organic electroluminescent display device according to a first exemplary embodiment of the present invention, the thin film transistor may have a bottom-gate-type structure as shown in FIG. 2a. More specifically, in the thin film transistor, an active layer 022 is disposed above a gate electrode 021, and the active layer 022 and the gate electrode 021 are insulated from each other by a gate insulating layer 06. A source electrode 023 and a drain electrode 024 are both disposed above the active layer 022. That is, the active layer 022 is located downstream of the gate electrode 021 in a direction away from a substrate 01, and both the source electrode 023 and the drain electrode 024 are located downstream of the active layer 022 in the direction away from the substrate 01.

In the organic electroluminescent display device according to second and third exemplary embodiments of the present invention, the thin film transistor may have a top-gate-type structure as shown in FIGS. 2b and 2c. Specifically, in the thin film transistor as shown in FIG. 2c, a gate electrode 021 may be disposed above an active layer 022, and a gate insulating layer 6 is disposed between the active layer 022 and the gate electrode 021. That is, the gate electrode 021 is located downstream of the active layer 022 in a direction away from a substrate 01. A source electrode 023 and a drain electrode 024 may be both disposed between the active layer 022 and the substrate 01. In the thin film transistor as shown in FIG. 2b, a gate electrode 021 may be disposed above an active layer 022, and a gate insulating layer 06 is disposed between the active layer 022 and the gate electrode 021. That is, the gate electrode 021 is located downstream of the active layer 022 in a direction away from a substrate 01. A source electrode 023 and a drain electrode 024 may be both disposed above the gate electrode 021 and are connected with the active layer 022 through vias hole formed in the gate insulating layer 06.

Further, in the above organic electroluminescent display device according to exemplary embodiments of the present invention, a luminescent layer 032 of the organic electroluminescent structure may emit light of three primary colors (red, blue and green) or light of multiple colors. In this case, the color filter may be removed from the organic electroluminescent display device. However, the luminescent layer 032 of the organic electroluminescent structure may emit white light, and is not limited to herein.

In the organic electroluminescent display device of the above embodiments, when the luminescent layer 032 of the organic electroluminescent structure emits white light, as shown in FIGS. 2a to 2c, the display device further comprises a color filter 04.

Specifically, when the thin film transistor has the bottom-gate-type structure, the color filter 04 is located on the upstream side of the organic electroluminescent structure in the direction away from the substrate 01. As illustrated in FIG. 2a, the color filter 04 may be disposed between the gate insulating layer 06 and the organic electroluminescent structure. In this case, light will be emitted from a bottom of the organic electroluminescent display device. In an alternative embodiment, the color filter 04 may also be disposed above the organic electroluminescent structure, the present invention, however, is not limited to herein. In this case, the light will be emitted from a top of the organic electroluminescent display device.

In another exemplary embodiment of the present invention, when the thin film transistor has a top-gate-type structure, the color filter 04 is located on the upstream side of the organic electroluminescent structure in the direction away from the substrate 1. As shown in FIGS. 2b and 2c, the color filter 04 is disposed below the organic electroluminescent structure. In this case, the light will be emitted from the bottom of the organic electroluminescent display device. In an alternative embodiment, the color filter 04 may also be disposed above the organic electroluminescent structure, the present invention, however, is not limited to herein. In this case, the light will be emitted from the top of the organic electroluminescent display device.

Specifically, in the above organic electroluminescent display device of the embodiments of the present invention, one side of the color filter is generally set as a light-exiting side of the OLED device. As shown in FIGS. 2a to 2c, the color filter 04 is disposed below the organic electroluminescent structure. In this case, the OLED device is a bottom-emission-type in which the light is emitted from the bottom of the organic electroluminescent display device. In an alternative embodiment, in the OLED device, it is also possible to change the light-exiting side of the OLED device by disposing a metal reflective layer. Thus, the OLED device is arranged as a top-emission-type in which the light is emitted from the top of the organic electroluminescent display device.

Figure 3:
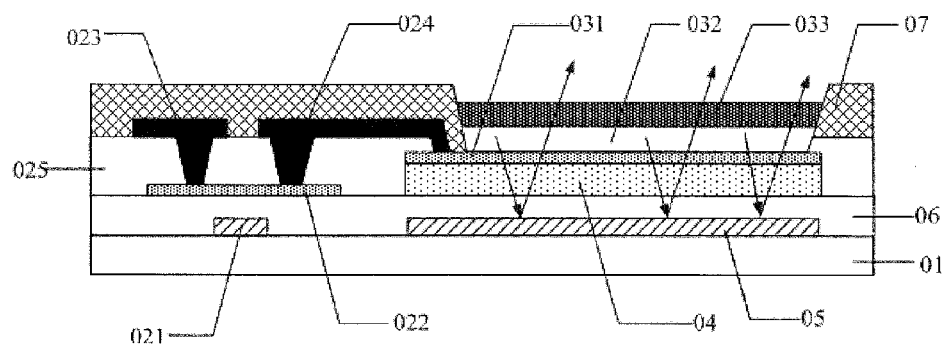
FIG. 3 is a schematic structural view of an organic electroluminescent display device according to a fourth exemplary embodiment of the present invention.

In an exemplary embodiment of the present invention, in order to cause the light emitted from both sides of the luminescent layer to exit from the light-exiting side of the OLED device to increase brightness of the OLED device, the above organic electroluminescent display according to the third exemplary embodiment of the present invention, in which the bottom-gate-type thin film transistor is used, further comprises a metal reflective layer 05, as shown in FIG. 3. The metal reflective layer 05 is disposed in a region corresponding to the organic electroluminescent structure on the substrate 01, and the metal reflective layer 05 and the gate electrode 021 are disposed in the same layer and made of the same material. In this case, during manufacturing, the metal reflective layer 05 and the gate electrode 021 may be produced in the same layer only through changing the pattern of the corresponding mask without any additional manufacturing process, thereby simplifying the process steps, saving production costs and improving production efficiency.

When both the metal reflective layer 05 and the color filter 04 are located on the same side of the organic electroluminescent structure, a side of the OLED device opposite to the color filter 04 is the light emitting side of the OLED device. As illustrated in FIG. 3, both the metal reflective layer 05 and the color filter 04 are disposed below the bottom of the organic electroluminescent structure, and the OLED device is the top-emission-type in which the light is emitted from the top of the organic electroluminescent display device. Specifically, a part of the light emitted by the luminescent layer 032 is directly emitted from the light-exiting side (the top side in FIG. 3) of the OLED device without passing through the color filter, and a part thereof firstly passes through the color filter 04, then is reflected by the metal reflective layer 05, and then is emitted from the light-exiting side of the OLED device after passing through the color filter 04 again. A specific optical path is shown by arrows in FIG. 3. However, in this case, since a part of the light emitted by the luminescent layer 032 is directly emitted from the light-exiting side of the OLED device without passing through the color filter, color purity of the OLED device may be adversely affected.

In the above organic electroluminescent display device according to the exemplary embodiment of the present invention, as shown in FIGS. 2a and 3, when the thin film transistor 02 has a bottom-gate structure, the thin-film transistor 02 may further comprise an etch barrier layer 025 disposed between the source electrode 023 and the active layer 022.

Further, in the above organic electroluminescent display device according to the exemplary embodiment of the present invention, the luminescent layer may comprise film layers such as a hole injection layer, a hole transport layer, an organic luminescent layer, an electron transport layer, an electron injection layer, which are formed of different organic materials. The specific luminescent layer structure belongs to the prior art, and description thereof in detail is omitted herein.

According to embodiments of another aspect of the present invention, there is provided a display apparatus comprising the above organic electroluminescent display device according to exemplary embodiments of the present invention. The display apparatus may be mobile phones, tablets, televisions, monitors, laptops, digital photo frames, navigators and any other products or components with display function. Other essential components in the display apparatus are appreciated for those skilled in the art, thus not repeated herein, nor should be construed to limit the invention. Embodiments of the display apparatus may refer to that of the organic electroluminescent display device as described above, and the same parts are not repeated herein.

According to embodiments of yet another aspect of the present invention, there is provided a method for manufacturing any one of the organic electroluminescent display device as described above, in a step of forming a thin film transistor and an organic electroluminescent structure on a substrate, forming an active layer of the thin film transistor and an anode of the organic electroluminescent structure by using an single patterning process, and performing a plasma treatment on the formed anode to increase concentration of carriers therein.

In the method for manufacturing the organic electroluminescent display device according to the exemplary embodiment of the present invention, since the active layer of the thin film transistor and the anode of the organic electroluminescent structure are formed by the single patterning process, the active layer and the anode may be simultaneously produced only by changing the pattern of the corresponding mask without additional pattering process for manufacturing the anode, thereby simplifying process steps, saving production costs, improving production efficiency and shortening production time.

Further, in the above method, the step of forming the thin film transistor on the substrate comprises: forming the gate electrode on the substrate, forming the active layer on the substrate formed with the gate electrode, and forming the source electrode and the drain electrode on the substrate formed with the active layer, wherein a metal reflective layer is formed in a region on the substrate corresponding to the organic electroluminescent structure while forming the gate electrode of the thin film transistor on the substrate. In this way, it is possible to further simplify the production process and save production costs.

The above method for manufacturing organic electroluminescent display device will be described hereafter taken manufacturing the organic electroluminescent display device as shown in FIG. 3 as an example.

Figure 4A:
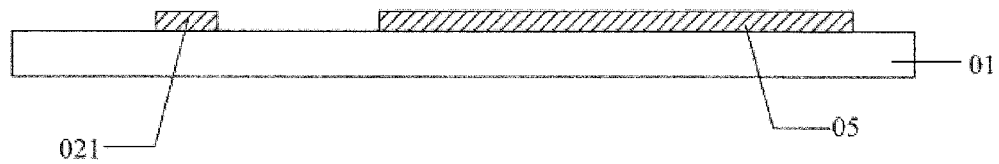
FIGS. 4a to 4i is a schematic view of a process for manufacturing the organic electroluminescent display device as shown in FIG. 3.
Figure 4B:
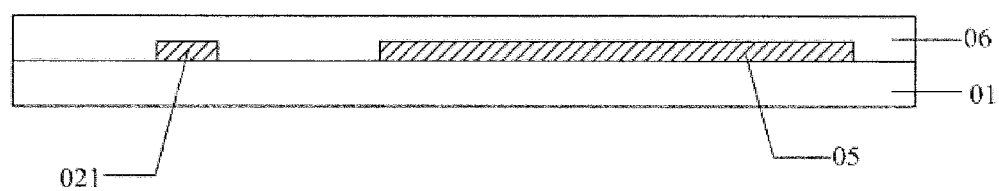
Figure 4C:
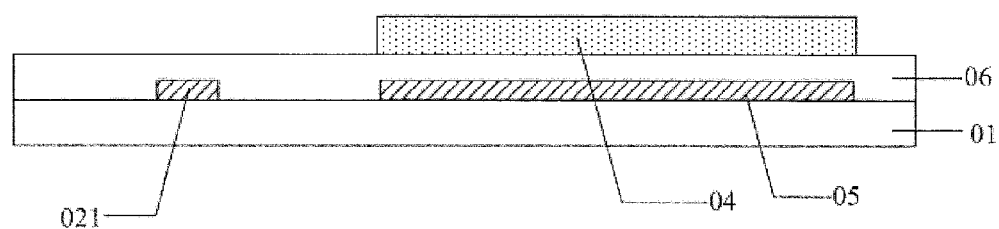
Figure 4D:
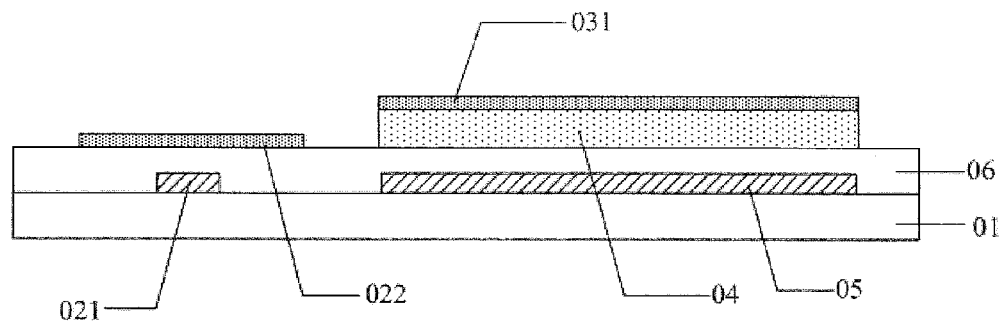
Figure 4E:
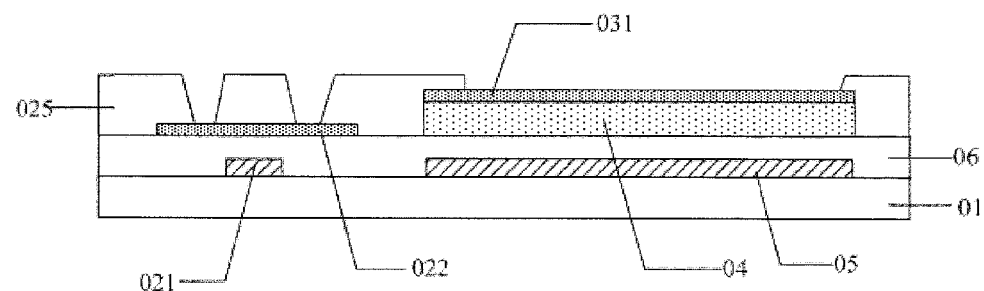
Figure 4F:
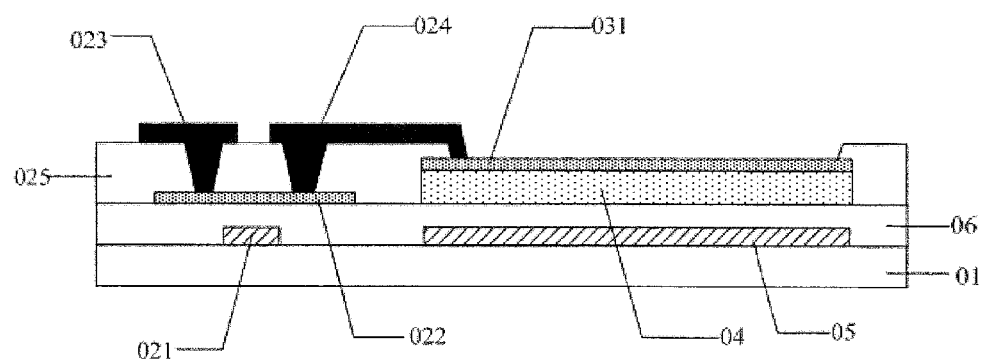
Figure 4G:
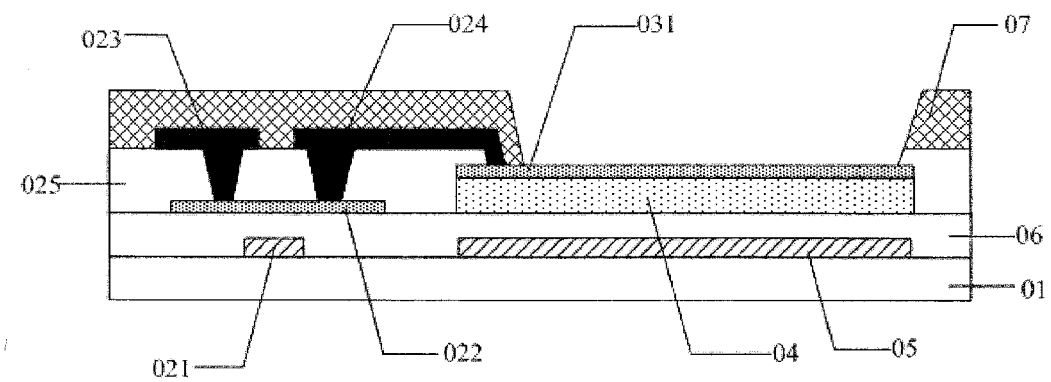
Figure 4H:
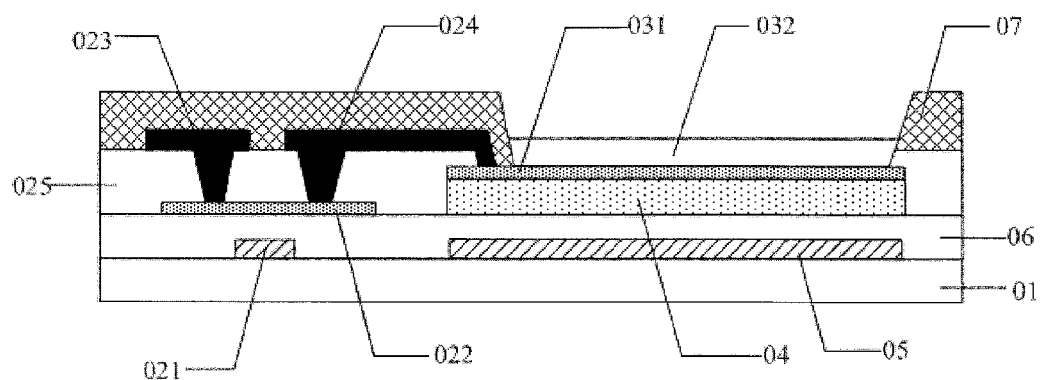
Figure 4I:
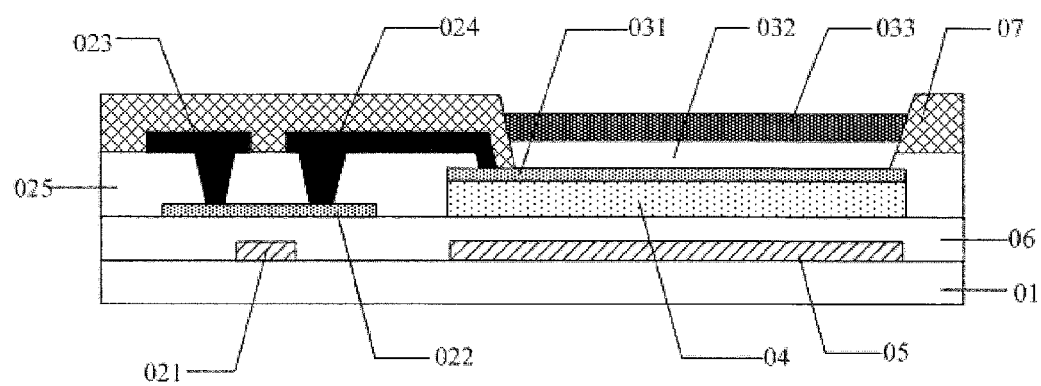

Specifically, the method for manufacturing the organic electroluminescent display device as shown comprises steps of:

(1) forming patterns of a gate electrode 021 and a metal reflective layer 05 on a substrate 01 through a single patterning process, as shown in FIG. 4a;

(2) depositing a gate insulating layer 06 on the gate electrode 021 and the metal reflective layer 05, as shown in FIG. 4b;

(3) forming a pattern of a color filter 04 on the gate insulating layer 06, as shown in FIG. 4c;

(4) forming patterns of an active layer 022 and an anode 031 on the color filter 04 through a single patterning process, as shown in FIG. 4d;

(5) forming a pattern of an etch stop layer 025 on the active layer 022, as shown in FIG. 4e, during a specific manufacturing process, after forming the pattern of the etch stop layer 025, a plasma treatment is performed on the anode to increase concentration of carriers therein;

(6) forming patterns of a source electrode 023 and a electrode drain 024 on the etch stop layer 025 through a single patterning process, as shown in FIG. 4f;

(7) forming a pattern of a pixel defining layer 07 on the source electrode 023 and the drain electrode 024, as shown in FIG. 4g;

(8) forming a luminescent layer 032 the anode 031, as shown in FIG. 4h;

(9) depositing a cathode 033 on the luminescent layer 032, as shown in FIG. 4i.

In this way, the organic electroluminescent display device according to the embodiment of the present invention as shown in FIG. 3 will be achieved through the above steps (1) to (9). In the above steps, the anode and the active layer are formed through single patterning process, and the metal reflective layer and the gate electrode are formed through single patterning process. Therefore, when producing the anode, the active layer, the metal reflective layer and the gate electrode, two masks are used to perform the patterning processes. However, in the existing method for producing OLED device, forming patterns of the anode, the active layer, the metal reflective layer and the gate requires four mask patterning processes. Therefore, the method of the present intention may simplify production process, save production costs and shorten production time as compared with the conventional production method.

It should be noted that the patterning process may only include a lithography process, or may include a photolithography process and an etching process in the above method for producing the organic electroluminescent display device according to embodiments of the present invention. Further, the patterning process may include other processes for forming predetermined patterns such as printing, ink jet. Generally, the photolithography process refers to a process for forming patterning through using photoresist, masks, exposure machines and the like in the process comprising a film formation, exposure, development and the like. In the specific implementation, it is possible to select appropriate pattering process according to the structure formed in the present invention.

According to exemplary embodiments of the present invention, there is provided an organic electroluminescent display device, a method for manufacturing the same and a display apparatus. The display apparatus comprises the substrate and the thin film transistor and the organic electroluminescent structure formed on the substrate. The thin film transistor includes the gate and the active layer insulated from each other, and the source electrode and the drain electrode electrically connected with the active layer, respectively. The organic electroluminescent structure includes the anode, the luminescent layer and the cathode which are disposed to be sequentially stacked in a direction away from the substrate, wherein the anode and the drain electrode are electrically connected with each other. The anode and the active layer are disposed in the same layer. The active layer is made of a transparent oxide semiconductor material, and the anode is made of the transparent oxide semiconductor material underdone the plasma treatment. In the OLED device, since the active layer is made of the transparent oxide semiconductor material, and performing the plasma treatment on the oxide semiconductor material may increase concentration of carriers in the oxide semiconductor material, it is possible to use the oxide semiconductor material of which the active layer is made to produce the anode, so that the anode layer and the active layer are disposed in the same layer. In this way, when manufacturing the OLED device, the active layer and the anode may be simultaneously produced only by changing the pattern of the corresponding mask without additional patterning processes for producing the anodes, thereby simplifying process steps, saving production costs, improving production efficiency and shortening production time.

It would be appreciated by those skilled in the art that various changes or modifications may be made in these embodiments without departing from the principle and spirit of the disclosure, and the present invention is not limited to the exemplary embodiment as described and shown above. Thus, the present invention intends to protect these changes and modifications falling within the scope claimed in claims and their equivalents.

What is claimed is:

1. An organic electroluminescent display device comprising:
    a substrate;
    a thin film transistor disposed on the substrate and comprising a gate electrode and an active layer insulated with each other, and a source electrode and a drain electrode electrically connected with the active layer;
    an organic electroluminescent structure disposed on the substrate and comprising an anode, a luminescent layer and a cathode stacked sequentially, the anode and the drain electrode being electrically connected with each other;
    a metal reflective layer which is disposed in a region corresponding to the organic electroluminescent structure, the metal reflective layer and the gate electrode both being disposed on the substrate and made of the same material; and
    a gate insulating layer, the metal reflective layer and the gate electrode both being disposed between the gate insulating layer and the substrate,
    wherein the anode and the active layer are disposed in the same layer, the active layer is made of a transparent oxide semiconductor material, and the anode is made of the transparent oxide semiconductor material undergone a plasma treatment.

2. The organic electroluminescent display device according to claim 1, wherein in the thin film transistor,
    the active layer is disposed above the gate electrode;
    a gate insulating layer is disposed between the active layer and the gate electrode; and
    both the source electrode and the drain electrode are disposed above the active layer.

3. The organic electroluminescent display device according to claim 2,
    wherein the luminescent layer of the organic electroluminescent structure is configured to emit white light, and
    the organic electroluminescent display device further comprises a color filter which is disposed above the organic electroluminescent structure or between the gate insulating layer and the organic electroluminescent structure.

4. A display apparatus comprising an organic electroluminescent display device, the organic electroluminescent display device comprising:
    a substrate;
    a thin film transistor disposed on the substrate and comprising a gate electrode and an active layer insulated with each other, and a source electrode and a drain electrode electrically connected with the active layer; and
    an organic electroluminescent structure disposed on the substrate and comprising an anode, a luminescent layer and a cathode stacked sequentially, the anode and the drain electrode being electrically connected with each other;
    a metal reflective layer which is disposed in a region corresponding to the organic electroluminescent structure, the metal reflective layer and the gate electrode both being disposed on the substrate and made of the same material; and
    a gate insulating layer, the metal reflective layer and the gate electrode both being disposed between the gate insulating layer and the substrate,
    wherein the anode and the active layer are disposed in the same layer, the active layer is made of a transparent oxide semiconductor material, and the anode is made of the transparent oxide semiconductor material undergone a plasma treatment.

5. The display apparatus according to claim 4, wherein in the thin film transistor,
    the active layer is disposed above the gate electrode;
    a gate insulating layer is disposed between the active layer and the gate electrode; and
    both the source electrode and the drain electrode are disposed above the active layer.

6. The display apparatus according to claim 5,
    wherein the luminescent layer of the organic electroluminescent structure is configured to emit white light, and
    the organic electroluminescent display device further comprises a color filter which is disposed above the organic electroluminescent structure or between the gate insulating layer and the organic electroluminescent structure.

7. A method for manufacturing an organic electroluminescent display device according to claim 1, comprising steps of:
    forming the gate electrode and the metal reflective layer on the substrate by using a single patterning process;
    depositing the gate insulating layer on the gate electrode and the metal reflective layer;
    forming the active layer and the anode by using a single patterning process; and
    performing the plasma treatment on the formed anode;
    forming the source electrode and drain electrode which are electrically connected with the active layer, the anode and the drain electrode being electrically connected with each other;
    forming the luminescent layer on the anode; and
    forming the cathode on the luminescent layer, the anode, the luminescent layer and the cathode constituting the organic electroluminescent structure.

* * * * *